United States Patent
Roider

(10) Patent No.: US 6,668,524 B2
(45) Date of Patent: Dec. 30, 2003

(54) PACKAGING SYSTEM WITH A TOOL FOR ENCLOSING ELECTRONIC COMPONENTS, AND METHOD OF POPULATING A CARRYING BELT

(75) Inventor: Peter Roider, Barbing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/068,637

(22) Filed: Feb. 6, 2002

(65) Prior Publication Data

US 2002/0116906 A1 Aug. 29, 2002

(30) Foreign Application Priority Data

Feb. 6, 2001 (DE) .......................................... 101 05 595

(51) Int. Cl.[7] .............................................. B65B 51/10
(52) U.S. Cl. ............................. 53/478; 53/467; 53/471; 53/475; 53/329.2; 53/329.3; 53/329.4
(58) Field of Search .................. 53/467, 471, 475–478, 53/329.2, 329.3, 329.4; 156/290, 308.2, 308.4, 309.6, 583.1

(56) References Cited

FOREIGN PATENT DOCUMENTS

| JP | 08 318 902 A | 12/1996 |
| JP | 10 147 303 A | 6/1998 |
| JP | 11 238 995 A | 8/1999 |

*Primary Examiner*—Rinaldi I. Rada
*Assistant Examiner*—Hemant M. Desai
(74) *Attorney, Agent, or Firm*—Laurence A. Greenberg; Werner H. Stemer; Gregory L. Mayback

(57) ABSTRACT

A packaging system and a method of populating a transport belt with a tool for enclosing electronic components in a carrying belt, is described. For this purpose, the device has a heated punch with a structured punch face that has a plurality of mutually spaced punch face strips, which do not cover openings in the carrying belt. One of the punch face strips provided on an upper side of the carrying belt is not covered by the covering film.

20 Claims, 3 Drawing Sheets

PACKAGING SYSTEM WITH A TOOL FOR ENCLOSING ELECTRONIC COMPONENTS, AND METHOD OF POPULATING A CARRYING BELT

BACKGROUND OF THE INVENTION

1. Field of the Invention

The invention relates to a packaging system with a tool for enclosing electronic components on a carrying belt, and a method of populating the carrying belt.

To enclose electronic components on a carrying or transport belt, a covering film is applied to the transport belt. The covering film covers openings on the upper side of the carrying belt, in which the electronic components to be transported are located. To enclose the electronic components, the covering film is laid over the openings and pressed onto the carrying belt with a hot tool, the openings in which the electronic components are located being sealed.

After the sealing operation, the carrying belt must comply with geometric and physical parameters predefined in accordance with the EIA Standard No. 481-1A. The pull-off force of the covering film from the carrying belt, which has to be complied with in accordance with the standard, should lie in the range of 0.1 to 1 N for the covering film, in order to be able to remove the components from the openings in the carrying belt with little expenditure of force in an automatic insertion machine. In addition, the value of the pull-off force should offer adequate security in order that the covering film cannot be detached during transport. Furthermore, the curvature over a width of the carrying belt must not exceed a limiting value. The curvature or bulging or bowing must not be greater than 1 mm over 250 mm. Therefore, the ratio of bending in millimeters to the width of the belt in millimeters must not exceed 1:250. While in the case of belts made of plastic, compliance with the limiting values of the standard is relatively unproblematic, the result is continual failures during the packaging and enclosure of electronic components in hygroscopic carrying belts.

SUMMARY OF THE INVENTION

It is accordingly an object of the invention to provide a packaging system with a tool for enclosing electronic components, and a method of populating a carrying belt that overcome the above-mentioned disadvantages of the prior art devices and methods of this general type, with which, irrespective of the carrying belt material used, reliable enclosure of the electronic components in the carrying belt can be implemented. In particular, it is an object of the invention to minimize the high failures when hygroscopic carrying belts are used.

With the foregoing and other objects in view there is provided, in accordance with the invention, a packaging system. The packaging system contains a tool for enclosing electronic components disposed in openings formed in an upper side of a carrying belt having a given width. The tool has a heatable punch with a punch face. In a rest position the punch face is disposed parallel to a covering film disposed on the carrying belt. The covering film has a width that is less than the given width of the carrying belt. The punch face has a plurality of punch face strips spaced apart from one another and are disposed so as to not overlap the openings in the carrying belt. In a sealing position of the tool, at least one of the punch face strips is disposed on the upper side of the carrying belt in a region not covered by the covering According to the invention, the packaging system is specified with the tool for enclosing the electronic components in the carrying belt. Carrying belts of this type have on their upper side openings to accommodate individual electronic components. Such openings can be blind openings, which have been made in the carrying belt, or can be through openings, in which, before being used in a packaging system, a bottom film has been applied to the rear side of the carrying belt with the through holes, in order to close the latter on one side.

The tool of the packaging system according to the invention has a heatable punch, whose punch face, in the rest position, is disposed parallel to a covering film for the carrying belt. Here, the covering film has a smaller width than the width of the carrying belt. The punch face of the punch has, according to the invention, a plurality of punch face strips spaced apart from one another. The strips are disposed in such a way that they do not cover the openings in the carrying belt, and at least one of the punch face strips is disposed on the upper side of the carrying belt that is not covered by the covering film in the sealing position of the tool.

The subject of the invention has the advantage that not only is the region to be sealed gripped and heated by the punch face in the edge region of the openings, but also the upper side of the carrying belt not covered by the covering film is in contact with the heated punch, on account of the at least one additional punch face strip. As a result, the carrying belt is heated up relatively uniformly over its entire area, so that even carrying belts made of hygroscopic material do not distort during heating and sealing and thus remain within the specified curvature tolerance range of the EIA Standard 481-1A.

By use of the invention, the material-induced waste, in particular for belts with hygroscopic properties, is thus reduced, so that the punch face configuration supplies sealing results, irrespective of the type and the material of the carrying belt, which completely satisfy the limiting values of the above standard for carrying belts. Although the tool and the packaging system according to the invention can be used particularly advantageously for hygroscopic carrying belts, it can also be used successfully to process less hygroscopic belts, such as plastic belts.

In one embodiment of the invention, the punch face of the tool has an offset. The offset corresponds to the height difference between the upper side of the carrying belt free of covering film and the upper side of the covering film in the sealing position. The offset therefore results from a different depth formation of the punch face strips on the one hand for the upper side of the carrying belt free of covering film and on the other hand for the upper side of the covering film in the sealing position. Consequently, the offset is slightly smaller than the thickness of the covering film, specifically by the amount by which the foil reduces during sealing in the region of the punch face strips on the upper side of the covering film.

In a further embodiment of the invention, cutouts are provided between the punch face strips, a first cutout corresponding to the region of the openings in the carrying belt. In the case of this embodiment of the invention, care is advantageously taken that no punch face region is disposed over one of the openings in the carrying belt, which avoids the risk that covering film material will be pressed into the opening.

A further preferred embodiment of the invention provides for the punch face to have a cutout at the transition from the upper side of the carrying belt free of covering film to the upper side of the carrying belt covered with covering film.

The cutout provides a clearance of the offset between the upper side of the carrying belt free of covering film and the upper side of the covering film in the sealing position. This makes it easier to align the covering film and the tool in the packaging system, since as a result of the clearance, a greater tolerance is permissible in aligning the covering film in the packaging system in relation to the tool and the punch face.

In addition, by the cutout at the transition from the upper side of the carrying belt free of covering film to the upper side of the covering film in the sealing position, it can be ensured that the edge of the punch face strip on the surface of the covering film does not coincide with the outer edge of the covering film or project beyond the latter. This ensures that no heat is introduced into the edge region and into the outer edges of the covering film. Introducing heat into the edges of the covering film increases the risk of stringing and of the covering film material sticking to the punch face of the tool. This risk does not arise in the packaging system according to the invention.

A further embodiment of the invention provides for the cutouts in the punch face to have different depths, the cutout depth of the cutout above the openings is greater than the cutout depth of the cutout between the upper side of the carrying belt free of the covering film and the upper side of the covering film in the sealing position. The different depths of the cutouts ensures for lower thermal coupling in the region of the openings in the carrying belt. This ensures that the coupling of heat into the covering film in the region of and over the openings in the carrying belt is low, such that incipient melting or melting of the covering film in the region of the openings is avoided, and the geometry of the covering film in the region of the openings in the carrying belt is maintained unchanged as a covering for the openings. With the lower depth of the cutout at the transition from the surface of the carrying belt free of covering film to the upper side of the covering film, it is still possible for sufficient heat to be dissipated to the upper side of the carrying belt, in order to achieve uniform heating of the carrying belt and therefore uniform drying and dehydration of hygroscopic carrying belts.

In a further embodiment of the invention, the bottom region of the punch or sealing shoe is configured with an E-shaped profile. In the case of the E-shaped profile of the sealing shoe, the result is a punch face having three punch face strips and two cutouts lying between them.

In one embodiment of the invention, a resistance heater is used as the punch heater. The resistance heater can be inserted into the punch body as a heating cartridge. This makes rapid replacement of the punch heater possible in the event of defects in the heating cartridge.

A further embodiment of the invention provides for a thermal detector to be disposed in the region of the punch face and for the packaging system to have a heat controller, which controls the punch face to a defined sealing temperature for the covering film. The heat controller has an operative connection to a power supply unit, which supplies the power for the punch heater. The heat controller is a PID controller with a proportional term P, an integral term I and a differential term D. Controllers of this type have the advantage that they react extremely quickly to temperature fluctuations and avoid overswings, so that a defined sealing temperature of the punch face can be maintained.

A further preferred embodiment of the invention provides for the punch face strips of the tool to be aligned with their length in the feed direction of the packaging system, it being possible for the length of the punch face strips to extend greater than a plurality of openings in the carrying belt. In the sealing position, the punch face strips on the covering film have a marginal spacing from the outer edges of the covering film, in order to minimize the risk of stringing.

With the foregoing and other objects in view there is further provided, in accordance with the invention, a method of populating a carrying belt with electronic components. The method includes the steps of providing a packaging system for transporting the carrying belt which has a given width, and heating up a tool of the packaging system. The tool has a punch with a punch face heated to a defined temperature and a temperature of the punch face is controllable. The punch face has a plurality of punch face strips distributed over the given width of the carrying belt. An electronic component is introduced into an opening formed in the carrying belt. A covering film is laid on the carrying belt over the opening containing the electronic component, and the covering film has a width narrower than the given width of the carrying belt.

The opening is closed by pressing the punch face, having the plurality of punch face strips, on the carrying belt having the covering film.

The method has the advantage that the entire width of the carrying belt is heated up by the punch face strips distributed over the punch face, so that the carrying belt can be heated uniformly over its entire width. On account of the uniform heating of the carrying belt in the packaging system according to the invention, in the case of the method, packaging of the electronic components is achieved without the carrying belt distorting or curving any more than is permissible after the enclosure of the electronic components in openings in the carrying belt. In addition, in the case of the method, independence of the material of the carrying belts is achieved, so that even carrying belts made of cellulosic materials like paper can be processed, without exceeding the standardized tolerance range for the permissible curvature over the width of the carrying belt, and also complying with the permissible pull-off force range of the covering film from the carrying belt after the enclosure of the electronic components.

A preferred performance example of the method provides for the temperature of the punch face to be controlled to 220° C. to 260° C., preferably to 240° C. In this temperature range, it has been shown that the packaging system according to the invention, with the corresponding tool and the correspondingly structured punch face, minimizes the curvature of the carrying belt. This is achieved by the heating being carried out, with a structured punch face, both of the edge region of the openings in the transport belt covered with a covering film and the upper side of the transport belt free of covering film. It is therefore even possible for hygroscopic carrying belts made of cellulosic material to be used, since carrying belts of this type are dried uniformly and similarly by the heated punch face during the sealing operation.

In a further performance example of the method, a paper belt is used as the carrying belt and, in order to accommodate electronic components, has through openings that, on the rear side of the carrying belt, are covered by a bottom film. Such paper carrying belts have the advantage that, on account of their hygroscopic properties, they are subject to reduced electrostatic charging as compared with plastic belts. Even as a result of the brief uniform drying during the enclosure of the electronic components in the carrying belt, on account of the uniform heating of the hygroscopic carrying belts, distortion or curvature of the carrying belts can be avoided to the greatest possible extent. As a bottom film, strips of felt can be adhesively bonded onto the rear side of the carrying belt in the region of through openings in the carrying belt.

In a further performance of the method, the punch is pressed repeatedly onto the covering film in one position with 20 N to 30 N for 50 ms to 100 ms. The number of pressing and heating operations which are carried out at each component position, that is to say for each opening in the carrying belt, can be defined and optimized by the length of the punch.

In a performance example of the method, the length of the punch corresponds to a length of n positions of openings on the carrying belt. With the packaging system, following each sealing operation, the carrying belt is transported onward by one position, so that the covering film is pressed n times onto a single position for 50 ms to 100 ms in each case.

In summary, it can be recorded that, on account of asymmetrical introduction of the thermal energy into a hygroscopic carrying belt, the moisture is partly removed only in regions of the sealing operation. It is therefore necessary to expect increased curvature values or else bowing values, which restricts the use of hygroscopic belts on account of tightened permissible tolerances for automatic insertion machines. However, it is advantageous to provide a hygroscopic belt for transport, storage and processing in automatic insertion machines, since the risk of electrostatic charging of electronic components that are enclosed in hygroscopic belts is reduced as compared with plastic belts.

Although a reduction in the curvature can be established by reducing the process parameters of a packaging system in relation to the pressing pressure, the sealing time and the sealing temperature, this results in a lower pull-off force of the covering film from the carrying belt, which increases the risk of loss of components from the carrying belt during transport. By use of the packaging system according to the invention with the tool according to the invention, the necessary heat for the sealing process is distributed over the entire belt width, and therefore the heating of the carrying belt is evened out, in spite of a narrower covering film.

Furthermore, the film is not sealed over its entire area, instead no heat is introduced in the edge region of the covering film, in order that no incipient melting occurs at the sealing shoe, the bottom region of the punch. In order to equalize the sealing shoe to the film thickness, it is additionally possible for the sealing shoe to be implemented in offset form in the region of the covering film.

As a result of introducing heat over the entire area, the moisture of the belt is reduced uniformly over the entire belt width, and therefore very low curvature or bowing is achieved. The customer therefore receives a rectilinear belt, which does not have any critical problems in guides in the subsequent automatic insertion machines.

Other features which are considered as characteristic for the invention are set forth in the appended claims.

Although the invention is illustrated and described herein as embodied in a packaging system with a tool for enclosing electronic components, and a method of populating a carrying belt, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
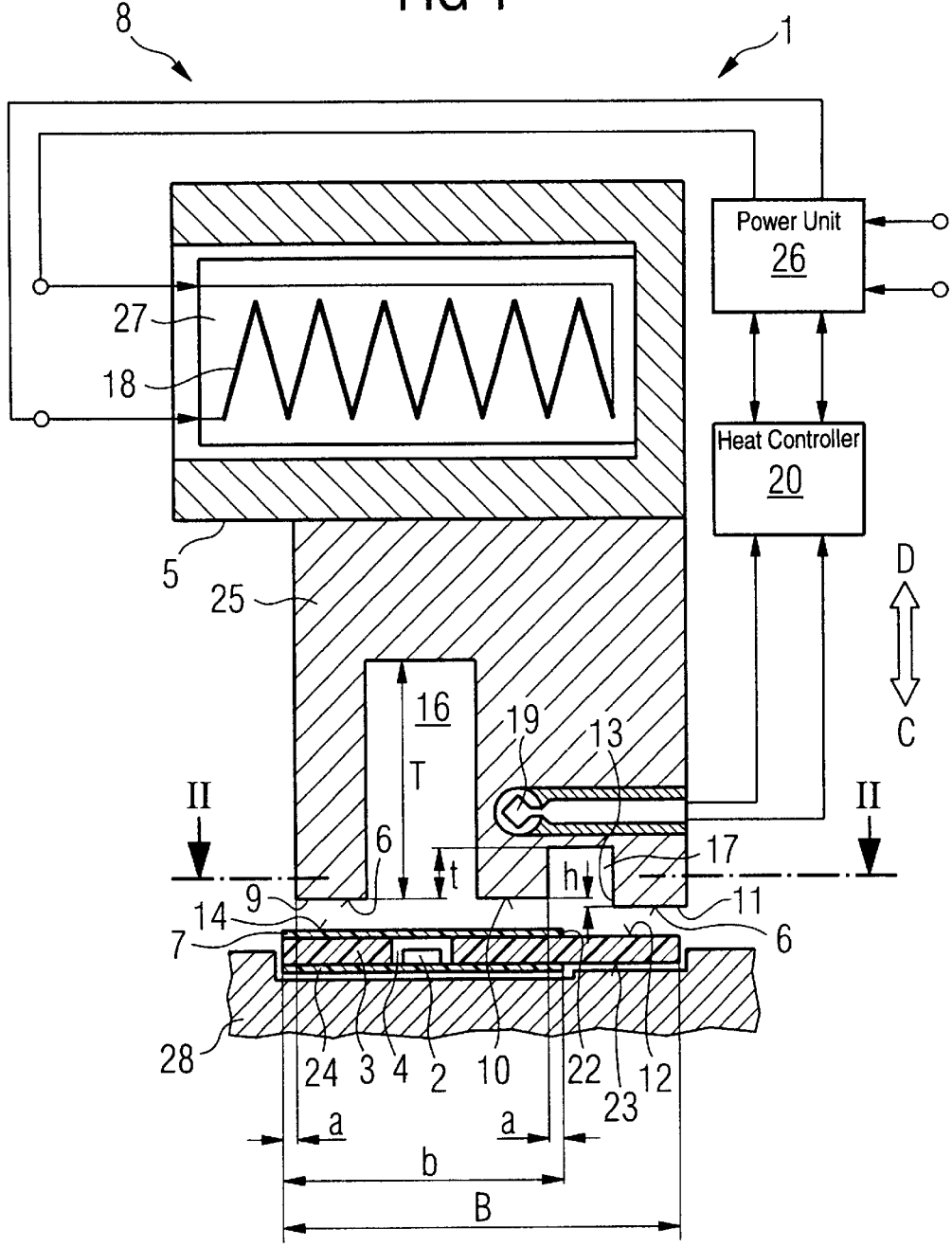
FIG. 1 is a diagrammatic, sectional view of an embodiment according to the invention.

In all the figures of the drawing, sub-features and integral parts that correspond to one another bear the same reference symbol in each case. Referring now to the figures of the drawing in detail and first, particularly, to FIG. 1 thereof, there is shown a schematic side-sectional view of an embodiment of the invention. In the embodiment, a packaging system has a temperature controller for a tool 1, with which a covering film 7 is applied to a carrying belt 3, in order to enclose electronic components 2 in openings 4 in the carrying belt 3 for transport purposes. For temperature control, a heat controller 20 in the form of a PID controller having a proportional term P, an integral term I and a differential term D is provided. The temperature is measured with the aid of a thermal detector 19, which is disposed in a sealing shoe 25 of the tool 1 in the vicinity of punch faces 6, and is supplied to the heat controller 20. The latter controls a power supply unit 26, which supplies heating power for a heating cartridge 27, which is provided as a resistance heater 18 in a punch body.

A profile of the sealing shoe 25 in a bottom region of a heated punch 5 has an E shape. In the embodiment, the sealing shoe has three punch face strips 9, 10 and 11.

In the rest position of the packaging system, shown in FIG. 1, the carrying belt 3 rests on a mounting table 28. The tool 1 is held by the packaging system at a distance above the carrying belt 3 partly covered by the covering film 7. The punch face 6 of the punch 5, in the rest position, is disposed parallel to the surface of the carrying belt 3 and the surface of the covering film 7. The covering film 7 has a smaller width b than a width B of the carrying belt 3. The punch face strips 9, 10 and 11 are spaced apart from one another, so that the openings 4 in the carrying belt 3 are kept not covered by the punch face strips 9–11.

A surface 12 of the carrying belt 3 that is not covered by the covering film 7 is likewise heated by the punch face strip 11 in the sealing position. Between the punch face strip 11 and the punch face strip 10, a cutout 17 is provided in the sealing shoe 25 and is disposed in such a way that the punch face 10 maintains a minimum distance a from the edge of the covering film 7. In addition, a height difference h is provided between the punch face strip 10 above the covering film 7 and the punch face strip 11 above the upper side of the carrying belt 3 free of the covering film 7, the difference taking into account the thickness of the covering film 7. It is therefore possible to ensure intensive thermal contact between the upper side of the carrying belt 3 free of the covering film 7 and the punch face strip 11.

The depth of the cutouts 16 and 17 between the punch face strips 9, 10 and 11 is different. A depth T of the cutout 16 between the punch face strips 9 and 10 is greater than a depth t of the cutout 17 between the punch face strips 10 and 11. With the greater depth T of the cutout 16, the heating in the region of the openings 4 in the carrying belt 3 is reduced, so that the covering film 7 over the openings 4 is maintained in a dimensionally stable manner during the sealing operation. The lower depth t of the cutout 17 has the effect that the thermal coupling is sufficiently high to heat the material of the carrying belt 3 uniformly but, on the other hand, not to begin to melt an edge region 22 of the covering film, in order to avoid stringing by the heated punch 5.

In the method of populating the carrying belt 3 with the electronic components 2, the carrying belt 3 is positioned on the mounting table 28. The openings 4 in the carrying belt 3 are populated with the electronic components 2, and the covering film 7 for covering the openings in the carrying belt 3 is disposed on the upper side of the carrying belt 3. After controlling the temperature of the punch body 5 to a punch temperature between 220 and 260° C., the tool 1 is pressed from its rest position in the direction of arrow C for 50 to 100 ms, with a pressing force of 20 N to 30 N, onto the upper side of the covering film and onto the upper side of the carrying belt free of covering film. The tool 1 is then lifted into its rest position in the direction of arrow D, and the carrying belt is transported onward under the tool 1 by one insertion position, at right angles to the plane of the drawing of FIG. 1.

The punch face strips 9, 10 and 11 have a length that covers a plurality of insertion positions simultaneously, so that one insertion position is subjected repeatedly to the pressing force and the heating temperature of the tool 1. In the process, as a result of the embodiment according to the invention of the packaging system and, in particular, of the punch face structure, not only is the covering film 7 for enclosing the components 2 in the openings 4 heated, but also the region of the surface of the carrying belt 3 that is free of covering film 7.

After the carrying belt 3 with the covering film 7 has passed through the packaging system, a populated carrying belt 3 is removed from the packaging system, the belt 3 being extremely flat and lying below the curvature limit which is predefined by the abovementioned international standard. Furthermore, as a result of the repeated application of the heated punch to the surface of the covering film 7, an adjustable pull-off force of the covering film from the carrying belt between 0.1 and 1 N is achieved with the aid of the punch face strips 9 and 10.

Figure 2:
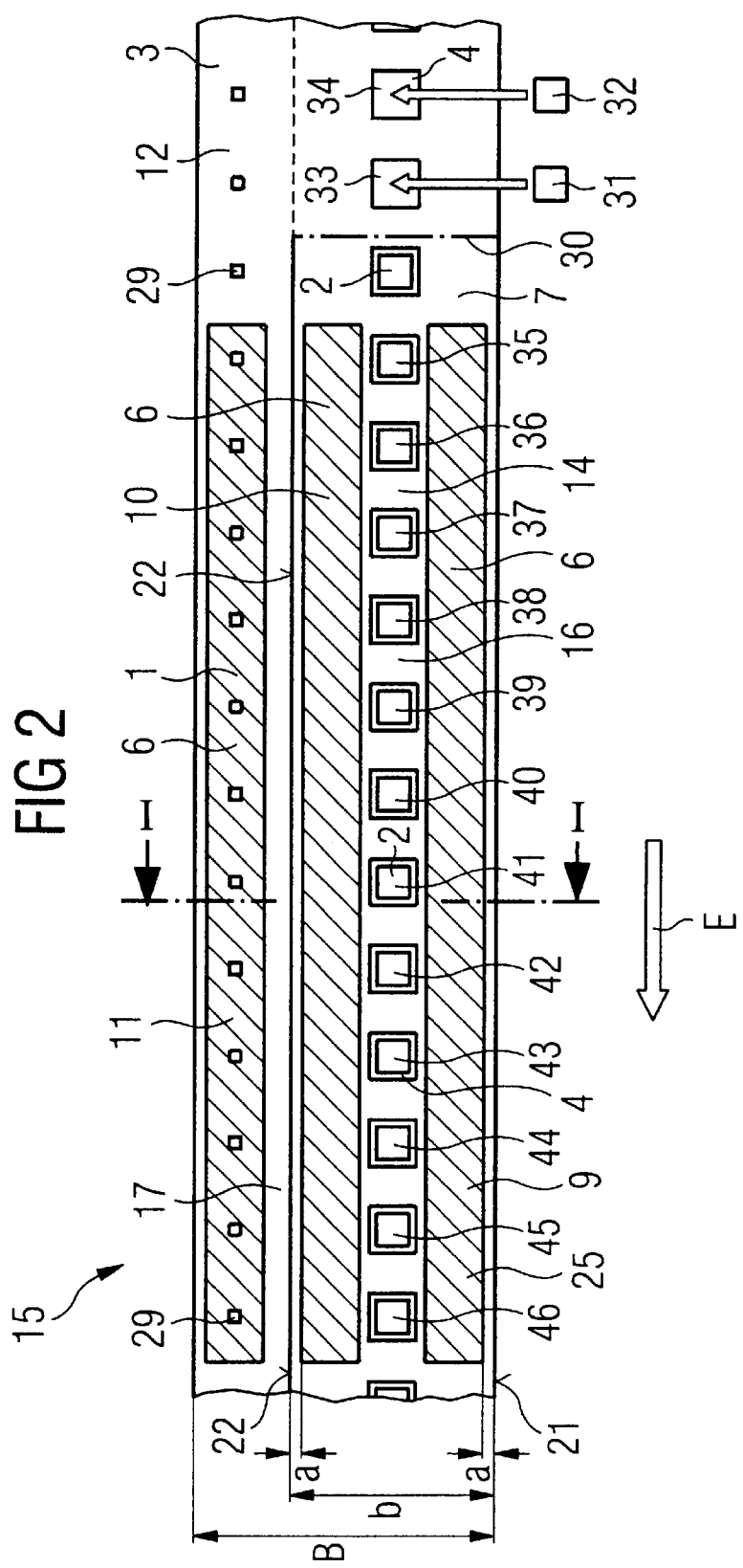
FIG. 2 is a sectional view of the embodiment shown in FIG. 1 taken along the line II—II.

FIG. 2 shows a schematic view of the embodiment according to FIG. 1 taken along the section line II—II. Components that fulfill the same functions as in FIG. 1 are identified by identical reference numbers and not specifically explained. A section line I—I shown in FIG. 2 shows the position at which the tool 1 of FIG. 1 was partly sectioned transversely. The tool 1 has not only the punch face strips 9 and 10 along the openings 4 in the carrying belt 3 populated with the electronic components 2 but, in addition, the punch face strip 11 which covers the surface 12 of the carrying belt 3 free of the covering film 7.

The region of the carrying belt 3 free of the covering film 7 has a perforation 29, in which feed mechanisms engage in order to transport the carrying belt 3 through the packaging system. The punch face strip 11 heats up this region with the perforation 29 of the carrying belt 3 in particular, in order to ensure uniform heating of the carrying belt 3 during the sealing operation. As a result of the uniform heating of the carrying belt 3, in the case of hygroscopic carrying belts, uniform dehydration is achieved, so that no permanent curvature of the carrying belt 3 is established following the introduction of the electronic components 2 and the passage through the packaging system.

The covering film 7 can be unwound from a covering film feed roll and applied to the surface of the carrying belt 3 in the region of a dash-dotted line 30. While the carrying belt 3 is transported from position to position (35 to 46) in the direction of arrow E, the tool 1 is pressed cyclically, vertically to the plane of the drawing, onto the covering film 7 and the surface 12 of the carrying belt 3 free of the covering film for the purpose of sealing.

In the embodiment shown in FIG. 2, a length of the punch face strips 9, 10 and 11 covers twelve positions (35 to 46) for the electronic components 2, so that as the carrying belt 3 passes through position by position, each component position is sealed twelve times for 50 to 100 ms. During the progressive sealing operation to enclose the components 2 in the carrying belt 3, further electronic components 31 and 32 are positioned in direction of arrows F and G in openings 33 and 34 provided for the purpose. When the dash-dotted line 30 for the covering film start is passed over, the covering film 7 is laid over the openings transported in the feed direction E and, during a further feed interval, reaches a first sealing position 35. After that, the covering film 7 is sealed cyclically a further twelve times as it passes through the length of the tool 1, until it reaches the last sealing position 46. During the sealing operation, the punch face strips 9 and 10 maintain a distance a from the edges 21 and 22 of the covering film 7, in order that the edges are not caused to begin to melt and cannot form any adhesive strings on the punch face strips 9 and 10.

Figure 3:
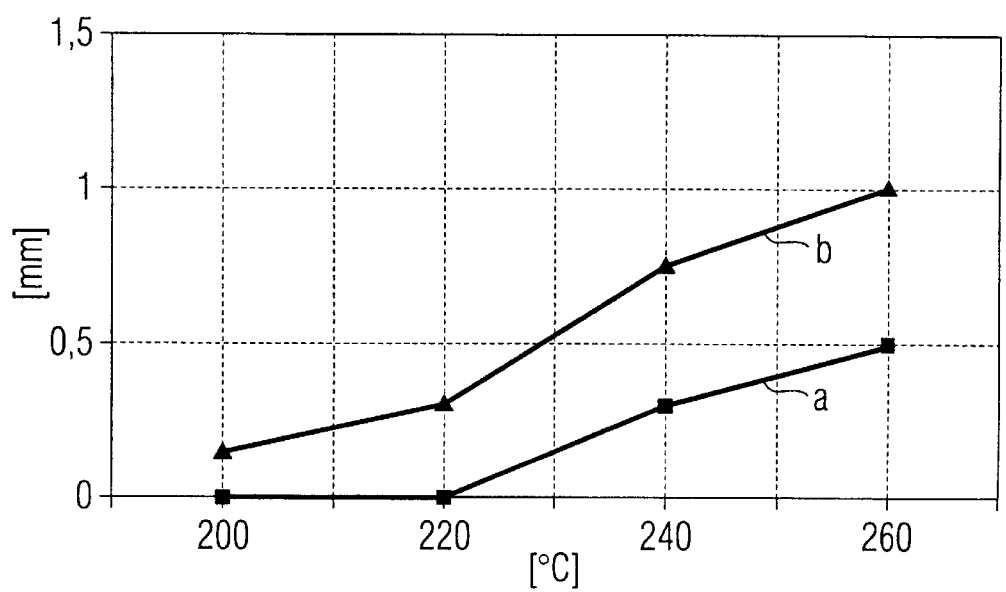
FIG. 3 is a graph showing comparative measured curves of a curvature of a paper belt with a felt bottom film following an application of a covering film by two differently structured punch faces.

FIG. 3 shows comparative measured curves a and b of the curvature of the paper belt 3 with a bottom film made of felt following the application of the covering film 7 by two differently structured punch faces. Plotted on the abscissa is the punch temperature in ° C., the curvature of the carrying belt 3 after the enclosure of electronic components 2 having been measured in steps of 20° C. in the range from 200 to 260° C. The curvature is plotted on the ordinate in millimeters, the curvature information in millimeters relating to a reference length of 250 mm, in accordance with the EIA Standard 481-1A.

The measurement was carried out at 56% relative atmospheric humidity at 22.5° C. ambient temperature, each pressing position having been occupied at a pressing force of 25 N for 70 ms. The covering film 7 applied is made of polystyrene, and the bottom film is made of felt, while the carrying belt 3 itself is a paper belt. The felt bottom film is adhesively bonded to the paper carrying belt 3, while the covering film 7 is applied by sealing with the aid of two differently structured punch faces. Measured curve a shows the result of a packaging system according to the invention having three punch face strips on the surface of the carrying belt. Measured curve b shows the result with a tool which has only two punch face strips in the region of the punch face strips 9 and 10 and no punch face strip 11 in the region of the surfaces 12 of the carrying belt 3 free of covering film in FIGS. 1 and 2.

At 200 and 220° C., the packaging system according to the invention does not result in any measurable curvature of the carrying belt over its width (see measured curve a) and, at sealing temperatures of 240 and 260° C., the curvature is below 0.5 mm. In contrast, in the case of the comparative measured curve b, curvature of the carrying belt 3 already occurs at temperatures of 200 and 220° C. and, at the temperatures 240 and 260° C., is at least twice as high as in the packaging system according to the invention. In this embodiment of the invention, an optimum sealing temperature in relation to the film pull-off force that, according to the above standard, should lie between 0.1 and 1 N, can be implemented at 240° C.

I claim:

1. A packaging system, comprising:
a tool for enclosing electronic components disposed in openings formed in an upper side of a carrying belt having a given width, said tool having a heatable punch with a punch face, in a rest position said punch face disposed parallel to Pa covering film disposed on the carrying belt, the covering film having a width less than the given width of the carrying belt, said punch face having a plurality of punch face strips spaced apart from one another and disposed so as to not overlap the openings in the carrying belt, and in a sealing position of said tool at least one of said punch face strips disposed on the upper side of the carrying belt in a region not covered by the covering film.

2. The packaging system according to claim 1, wherein said punch face has an offset corresponding to a height difference between the upper side of the carrying belt free of the covering film and an upper side of the covering film in the sealing position.

3. The packaging system according to claim 2, wherein said punch face has a cutout formed therein between two of said punch face strips in a region of the openings in the carrying belt.

4. The packaging system according to claim 3, wherein said punch face has a further cutout formed therein at a transition from the upper side of the carrying belt which is not covered by the covering film to the upper side of the carrying belt covered with the covering film.

5. The packaging system according to claim 4, wherein said cutout and said further cutout in said punch face have different depths.

6. The packaging system according to claim 5, wherein said heatable punch has bottom region formed with an E-shaped profile and functions as a sealing shoe.

7. The packaging system according to claim 1, wherein said heatable punch has a resistance heater.

8. The packaging system according to claim 1, wherein said heatable punch has a thermal detector in a region of said punch face.

9. The packaging system according to claim 1, wherein said tool has a heat controller for keeping said punch face at a defined sealing temperature for the covering film.

10. The packaging system according to claim 1, wherein said punch face strips of said tool are aligned with their length in a feed direction of the packaging system.

11. The packaging system according to claim 1, wherein in the sealing position with said tool on the covering film, said punch face strips have a marginal spacing from edges of the covering film.

12. The packaging system according to claim 1, wherein said punch face has a length extending longer than a plurality of the openings in the carrying belt.

13. A method of populating a carrying belt with electronic components, which comprises the following steps:
providing a packaging system for transporting the carrying belt, the carrying belt having a given width;
heating up a tool of the packaging system, the tool having a punch with a punch face heated to a defined temperature and a temperature of the punch face being controllable, the punch face having a plurality of punch face strips distributed over the given width of the carrying belt;
introducing an electronic component into an opening formed in the carrying belt, the opening not being overlapped by the punch face strips;
laying a covering film on the carrying belt over the opening containing the electronic component, the covering film having a width narrower than the given width of the carrying belt;
placing at least one of the punch face strips in a region of the carrying belt not covered by the covering film; and
closing the opening by pressing the punch face having the plurality of punch face strips on the carrying belt having the covering film.

14. The method according to claim 13, which comprises controlling the defined temperature of the punch face to be between 220° to 260° C.

15. The method according to claim 14, which comprises controlling the temperature of the punch face to be 240° C.

16. The method according to claim 13, which comprises using the tool having the punch face for heating up both an edge region of the opening in the carrying belt covered with the covering film and the region of the carrying belt not covered by the covering film.

17. The method according to claim 13, which comprises forming the carrying belt from a cellulosic material that is dried uniformly and similarly by the punch face.

18. The method according to claim 13, which comprises forming the carrying belt as a paper belt which, in order to accommodate the electronic components, has through openings formed therein and, a rear side of the carrying belt is covered by a bottom film.

19. The method according to claim 13, which comprises pressing the punch repeatedly onto the covering film in one position with a force of 20 N to 30 N and for 50 ms to 100 ins.

20. The method according to claim 13, which comprises forming the punch with a length corresponding to n positions of openings formed in the carrying belt, and in that, following each sealing operation, the carrying belt is transported onward by one position, so that the covering film is pressed n times on a single position for 50 ms to 100 ms in each case.

* * * * *